United States Patent
Lin et al.

(10) Patent No.: US 11,031,490 B2
(45) Date of Patent: Jun. 8, 2021

(54) FABRICATION OF FIELD EFFECT TRANSISTORS WITH FERROELECTRIC MATERIALS

(71) Applicant: Taiwan Semiconductor Manufacturing Co., Ltd., Hsin-Chu (TW)

(72) Inventors: Cheng-Ming Lin, Kaohsiung (TW); Sai-Hooi Yeong, Hsinchu County (TW); Chi On Chui, Hsinchu (TW); Ziwei Fang, Hsinchu (TW); Huang-Lin Chao, Hillsboro, OR (US)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/454,854

(22) Filed: Jun. 27, 2019

(65) Prior Publication Data
US 2020/0411662 A1    Dec. 31, 2020

(51) Int. Cl.
*H01L 29/66* (2006.01)
*H01L 29/51* (2006.01)
*H01L 21/02* (2006.01)

(52) U.S. Cl.
CPC ...... *H01L 29/6684* (2013.01); *H01L 21/0206* (2013.01); *H01L 21/02181* (2013.01); *H01L 21/02356* (2013.01); *H01L 29/516* (2013.01); *H01L 29/66545* (2013.01)

(58) Field of Classification Search
CPC .......... H01L 29/6684; H01L 21/02181; H01L 21/02356; H01L 29/516; H01L 29/66545
See application file for complete search history.

(56) References Cited

U.S. PATENT DOCUMENTS

| 9,978,868 B2 | 5/2018 | Lai et al. | |
| 2006/0154410 A1* | 7/2006 | Choi | H01L 29/6656 438/184 |
| 2009/0142899 A1* | 6/2009 | Jensen | H01L 29/513 438/287 |

(Continued)

OTHER PUBLICATIONS

Xinran Wang et al., "Atomic Layer Deposition of Metal Oxides on Pristine and Functionalized Graphene," Department of Chemistry and Laboratory for Advanced Materials, Stanford University, Stanford, CA 94305, American Chemical Society, vol. 130, No. 26 (2008), pp. 8152-8153.

*Primary Examiner* — Sheng-Bai Zhu
(74) *Attorney, Agent, or Firm* — Haynes and Boone, LLP

(57) ABSTRACT

A method of forming a semiconductor device includes forming a sacrificial layer on sidewalls of gate spacers disposed over a semiconductor layer, forming a first hafnium-containing gate dielectric layer over the semiconductor layer in a first trench disposed between the gate spacers, removing the sacrificial layer to form a second trench between the gate spacers and the first hafnium-containing gate dielectric layer, forming a second hafnium-containing gate dielectric layer over the first hafnium-containing gate dielectric layer and on the sidewalls of the gate spacers, annealing the first and the second hafnium-containing gate dielectric layers while simultaneously applying an electric field, and subsequently forming a gate electrode over the annealed first and second hafnium-containing gate dielectric layers.

20 Claims, 15 Drawing Sheets

(56) References Cited

U.S. PATENT DOCUMENTS

| | | | |
|---|---|---|---|
| 2009/0298247 A1* | 12/2009 | Kim | H01L 29/6653 438/294 |
| 2010/0181655 A1* | 7/2010 | Colombo | H01L 29/1606 257/635 |
| 2012/0181509 A1* | 7/2012 | Liang | H01L 29/66742 257/29 |
| 2012/0181616 A1* | 7/2012 | Chudzik | H01L 27/092 257/369 |
| 2013/0328111 A1* | 12/2013 | Xie | H01L 29/4236 257/288 |
| 2014/0054654 A1* | 2/2014 | Hsieh | H01L 29/66545 257/288 |
| 2014/0231885 A1* | 8/2014 | Xie | H01L 29/66477 257/288 |

* cited by examiner

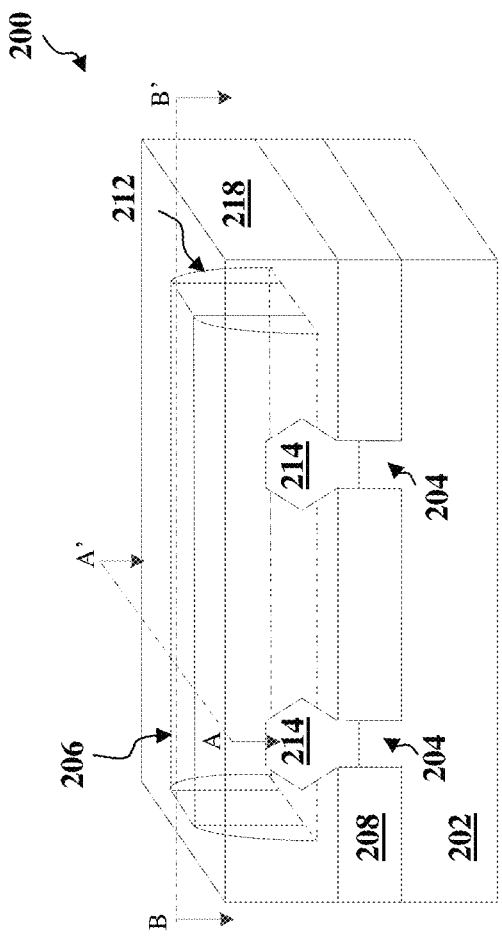
FIG. 2
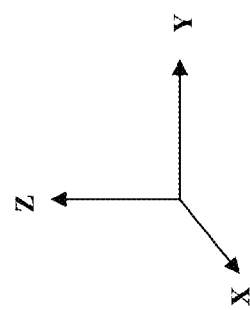

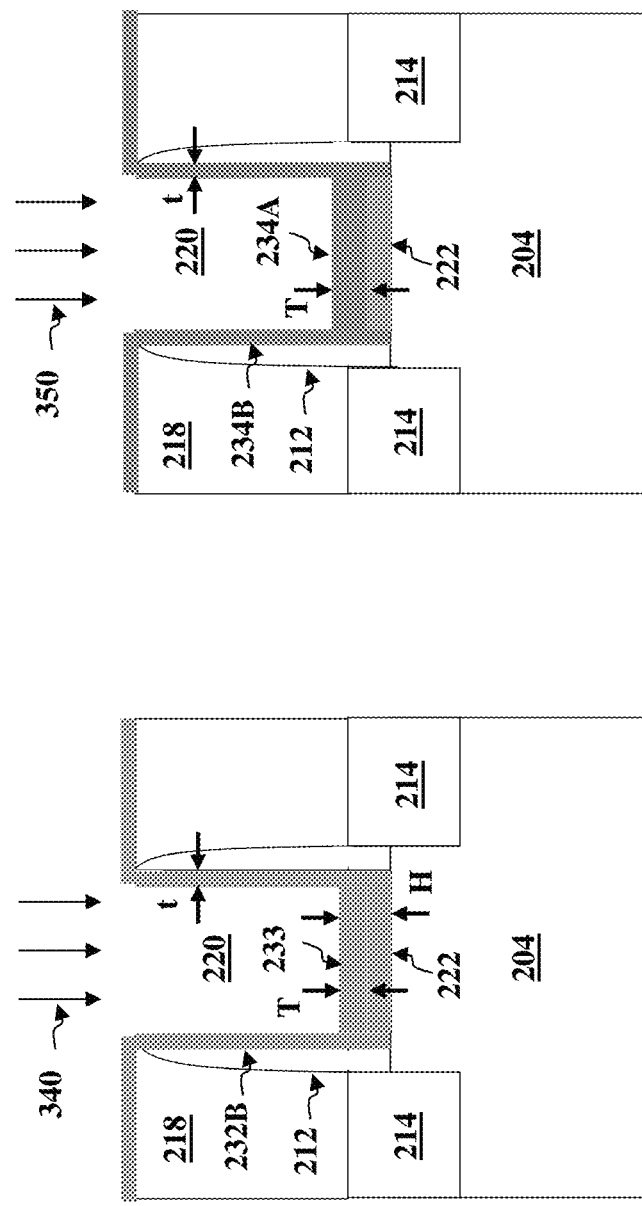

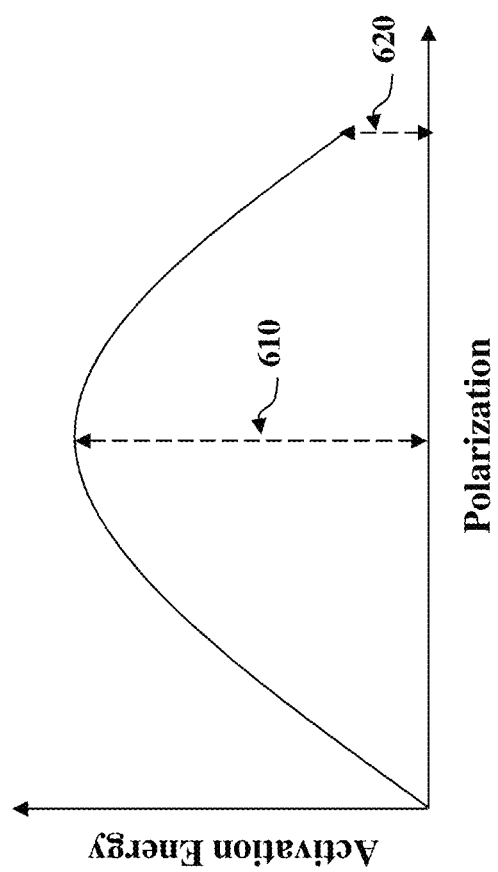

FABRICATION OF FIELD EFFECT TRANSISTORS WITH FERROELECTRIC MATERIALS

BACKGROUND

Integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, high-k metal gates (HKMGs) have been fabricated with various advanced materials to improve speed and reliability of the ICs at reduced length scales. Although methods for forming HKMGs have been generally adequate, they have not been entirely satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 illustrates a three-dimensional perspective view of an example semiconductor device in accordance with some embodiments of the present disclosure.

FIGS. 3, 5, 6, 7, 8, 9A, 9B, 9C, 9D, 12, 14A, 14B, 14C, 14D, and 14E illustrate cross-sectional views of the semiconductor device of FIG. 2 taken along line AA' at various stages of the method of FIG. 1 in accordance with some embodiments of the present disclosure.

FIG. 11 is a schematic representation of an example phase transformation process in accordance with some embodiments of the present disclosure.

DETAILED DESCRIPTION

Figure 1:
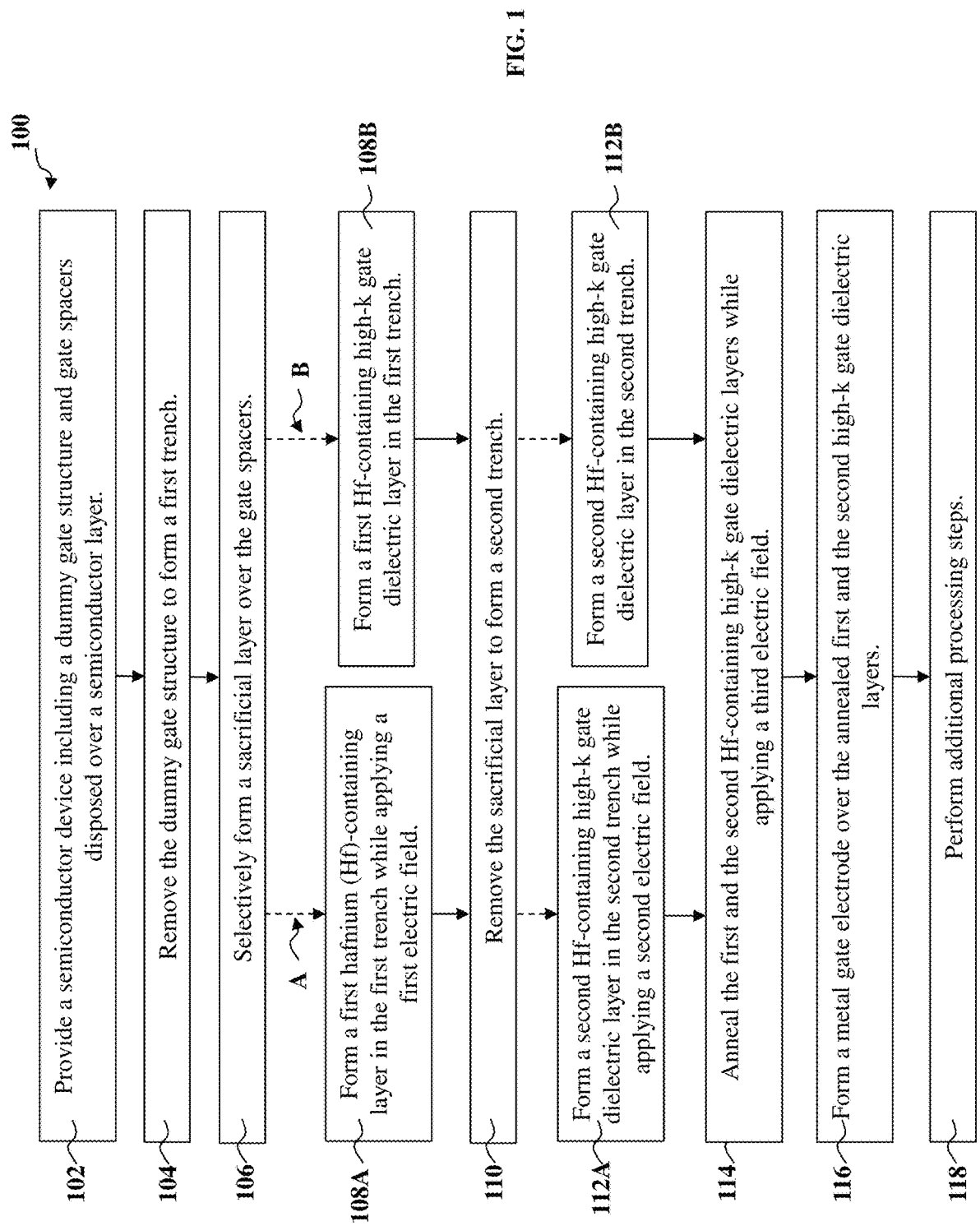
FIG. 1 is a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating high-k metal gates (HKMGs) in semiconductor devices, such as field-effect transistors (FETs). Throughout the present disclosure, "high-k" refers to a dielectric material having a dielectric constant k greater than that of silicon oxide, which is approximately 3.9.

Embodiments such as those described herein provide methods of forming HKMGs having a metal gate electrode disposed over a high-k gate dielectric layer. In particular, the present disclosure provides methods of forming ferroelectric high-k gate dielectric layer in HKMGs. Generally, ferroelectric high-k dielectric materials have been employed to allow devices (e.g., FETs) to operate in a negative capacitance regime (e.g., in a negative-capacitance FET, or NCFET) for improved device performance. In one such example, ferroelectric high-k dielectric materials allow formation of FETs with reduced subthreshold swing (SS). SS generally describes the amount of voltage required to switch a device on and off, and thus influences the operating speed of the device. In many instances, other factors being constant, a reduction in SS generally increases a switching speed of an FET. SS may be controlled by the degree of ferroelectricity of a gate dielectric material included in a gate stack, with a higher ferroelectricity correlating to a lower SS. In addition, ferroelectric high-k dielectric materials may also enlarge the memory window for improved performance of nonvolatile memory devices. Notably, dielectric materials having similar compositions (e.g., hafnium-based high-k dielectric materials) may possess different degrees of ferroelectricity depending upon their specific crystalline phases (distinguished by different space groups, for example). Although methods of forming devices with enhanced ferroelectric properties have been generally adequate, they have not been satisfactory in all aspects.

For example, crystalline $HfO_2$ in a high-k gate dielectric layer is generally obtained by thermally annealing amorphous or substantially amorphous $HfO_2$ to enable rearrangement of atoms within the amorphous phase and to form crystalline (e.g., orthorhombic) $HfO_2$. However, as device sizes continue to decrease, the high-k gate dielectric layer with reduced thickness causes the energy barrier (e.g., activation energy for crystallization) required for phase transformation to increase such that the post-deposition thermal annealing alone energetically falls short in its ability to convert amorphous $HfO_2$ to orthorhombic crystalline $HfO_2$. In one such example, it has been observed that when the thickness of the high-k gate dielectric layer reduces to about 5 nm and below, no amount or only a minimal amount of ferroelectric orthorhombic $HfO_2$ (i.e., a phase containing $HfO_2$ in the space group $Pca2_1$) may be formed after performing the thermal annealing process. One explanation for such phenomenon may be that as thickness reduces to length scales comparable to sizes of crystalline grains (e.g., within one order of magnitude in length scale), space available for the grains to form becomes inevitably limited, thereby presenting a greater energy barrier for crystallization process to occur.

In addition, as device sizes continue to decrease, parasitic capacitance between the HKMG and gate spacers may inadvertently increase, compromising device performance. Furthermore, if thickness of the high-k gate dielectric layer disposed on the gate spacers is substantially the same as that disposed over the underlying substrate, the available window for tuning threshold voltage of the metal gate may shrink, and the overall gate resistance may also increase as a result.

As will be discussed below, embodiments of the present disclosure are directed to methods of forming ferroelectric high-k gate dielectric layer in HKMGs at reduced length scales, addressing at least the concerns discussed above. In particular, methods of promoting transformation of amorphous $HfO_2$ to crystalline $HfO_2$, and more specifically, to crystalline $HfO_2$ in a ferroelectric orthorhombic phase are provided herein. Additionally, the present disclosure provides methods of enhancing the overall performance of HKMGs in applications such as NCFETs.

FIG. 1 illustrates a flow chart of a method 100 for forming a semiconductor device (hereafter referred to as "device") 200 in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with FIGS. 2-9D and 12-14E which illustrate various three-dimensional and cross-sectional views of the device 200 during intermediate steps of the method 100. In particular, FIG. 2 illustrates a three-dimensional view of the device 200, while FIGS. 3, 5-9D, 12, and 14A-14E illustrate cross-sectional views of the device 200 taken along line AA' as shown in FIG. 2, and FIGS. 4 and 13 illustrate cross-sectional views of the device 200 taken along line BB' as shown in FIG. 2.

The device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices, nanosheets, nanowires, etc.

Referring to FIGS. 1-4, the method 100 at operation 102 provides the device 200 that includes one or more fins 204 protruding from a substrate 202 and separated by isolation structures 208, a dummy gate stack 206 disposed over the fins 204, gate spacers 212 disposed on sidewalls of the dummy gate stack 206, epitaxial source/drain (S/D) features 214 disposed over the fins 204, and an interlayer dielectric (ILD) layer 218 disposed over the isolation structures 208 and the epitaxial S/D features 214. Though not depicted herein, the device 200 may include additional material layers suitable for various design requirements.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Each fin 204 may be suitable for providing an n-type FinFET or a p-type FinFET. The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

In some embodiments, the dummy gate stack 206 is provided as a placeholder for an HKMG and may include a dummy gate electrode comprising polysilicon. The dummy gate stack 206 may additionally include other material layers disposed between the dummy gate electrode and the fins 204. For example, the dummy gate stack may include an interfacial layer (not depicted) and/or a dummy gate dielectric layer (not depicted). As will be discussed in detail below, at least portions of the dummy gate stack 206 are replaced with the HKMG during a gate replacement process after other components (e.g., the epitaxial S/D features 214) of the device 200 are fabricated. Various material layers of the dummy gate stack 206 may be formed by any suitable process, such as CVD, physical vapor deposition (PVD), atomic layer deposition (ALD), chemical oxidation, other suitable processes, or combinations thereof.

The device 200 further includes gate spacers 212 disposed on sidewalls of the dummy gate stack 206. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure. The gate spacers 212 may be formed by first depositing a blanket of spacer material over the device 200, and then performing an anisotropic etching process to remove portions of the spacer material to form the gate spacers 212 on sidewalls of the dummy gate stack 206. In the present disclosure, the gate spacers 212 remain as portions of the device 200 during the subsequent gate replacement process.

Figure 3:
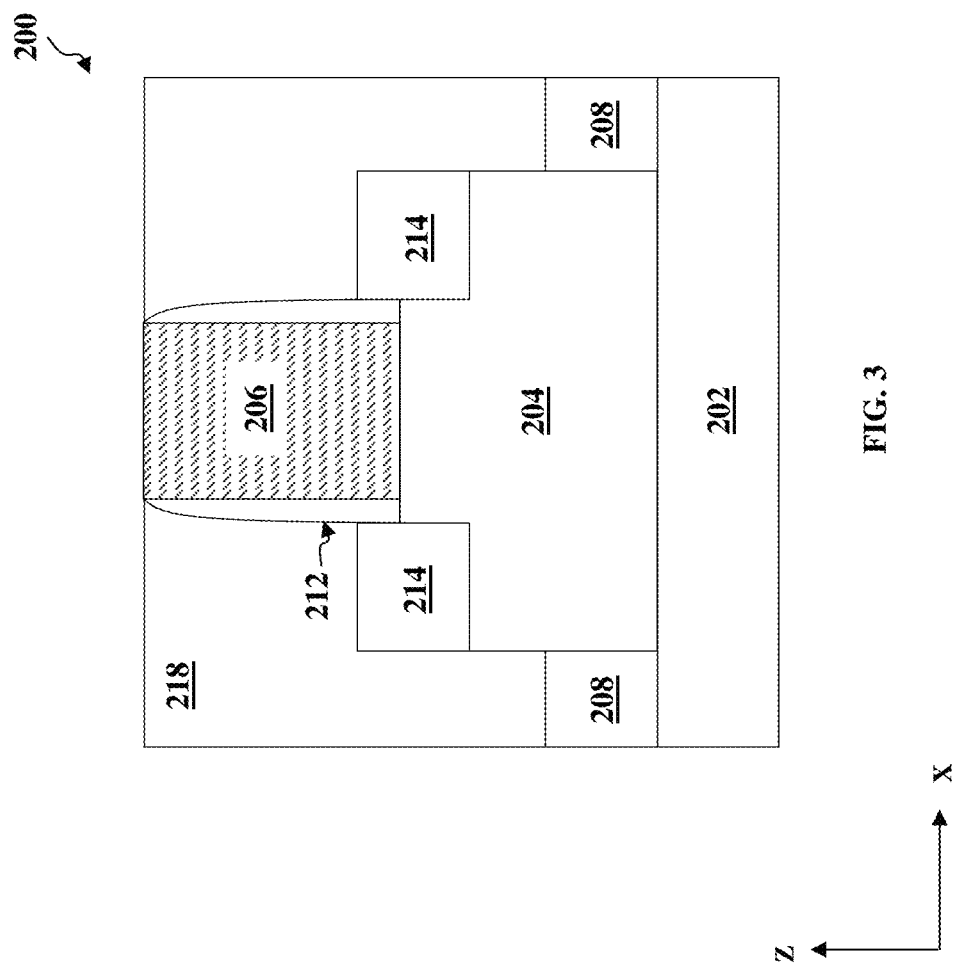
Figure 4:
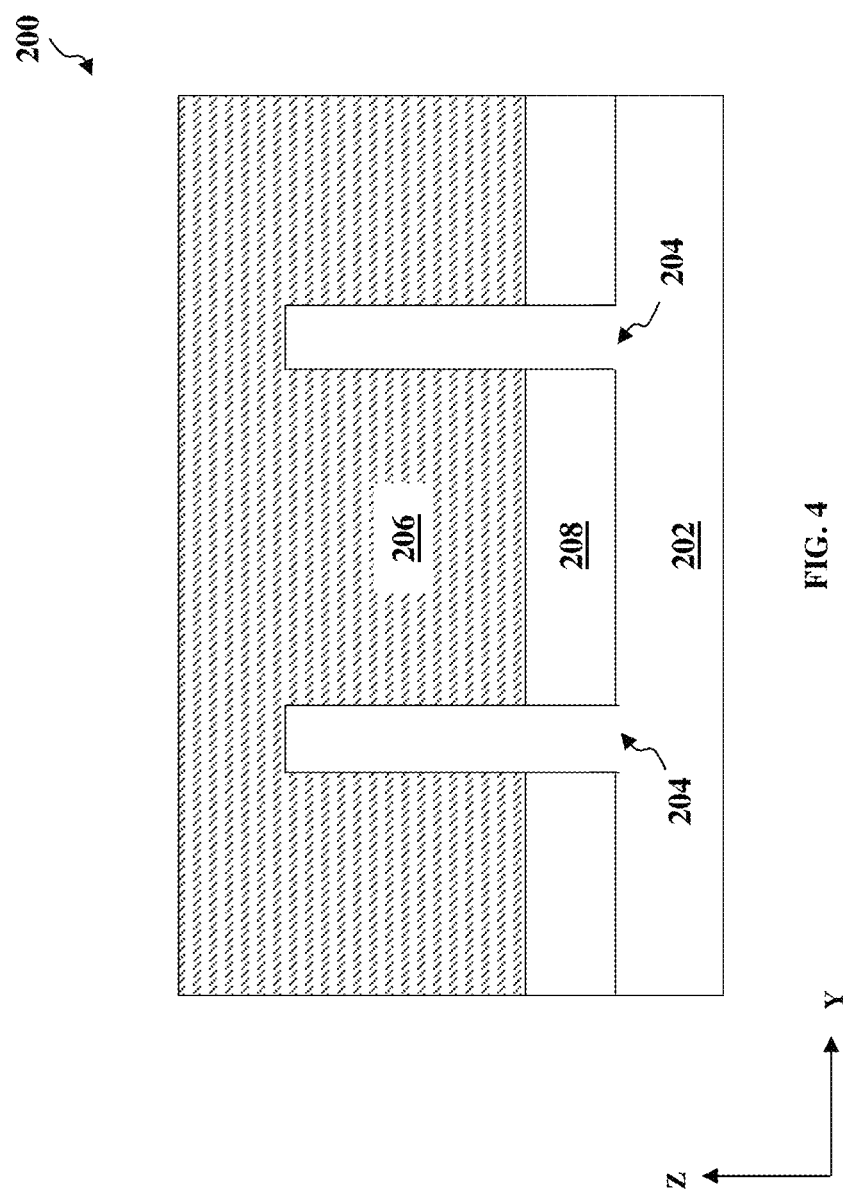
FIGS. 4 and 13 illustrate cross-sectional views of the semiconductor device of FIG. 2 taken along line BB' in accordance with some embodiments of the present disclosure.

Collectively referring to FIGS. 2 and 3, the device 200 includes epitaxial S/D features 214 disposed over the fins 204 and adjacent to the dummy gate stack 206. The epitaxial S/D features 214 may be formed by any suitable techniques, such as etching processes followed by one or more epitaxy processes. In one example, one or more etching processes are performed to remove portions of the fins 204 to form recesses (not depicted) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the epitaxial S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

Additionally, the device 200 includes the ILD layer 218, and optionally a contact etch-stop layer (CESL; not depicted), disposed over the substrate 202. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof. In some embodiments, forming the ILD layer 218 further includes performing a CMP process to planarize a top surface of the device 200, such that a top surface of the dummy gate stack 206 is exposed. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 5:
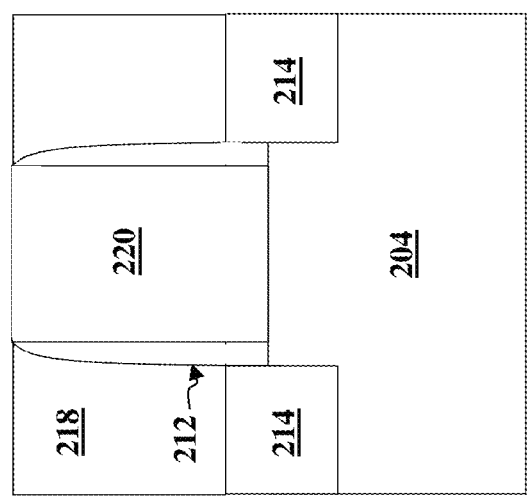
Figure 8:
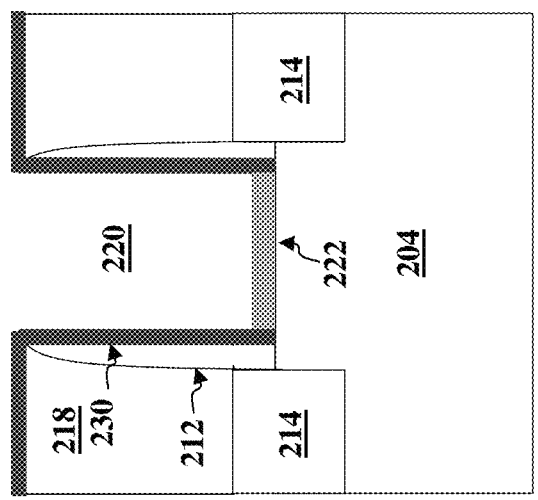

Now referring to FIGS. 1 and 5, the method 100 at operation 104 removes the dummy gate stack 206 to form a gate trench 220. In the depicted embodiment, the gate trench 220 exposes portions of the fins 204 and the isolation structures 208. The method 100 at operation 104 may include one or more etching processes that are selective to the materials included in the dummy gate stack 206 (e.g., polysilicon). The etching processes may include dry etching, wet etching, RIE, or other suitable etching methods, or combinations thereof.

Figure 6:
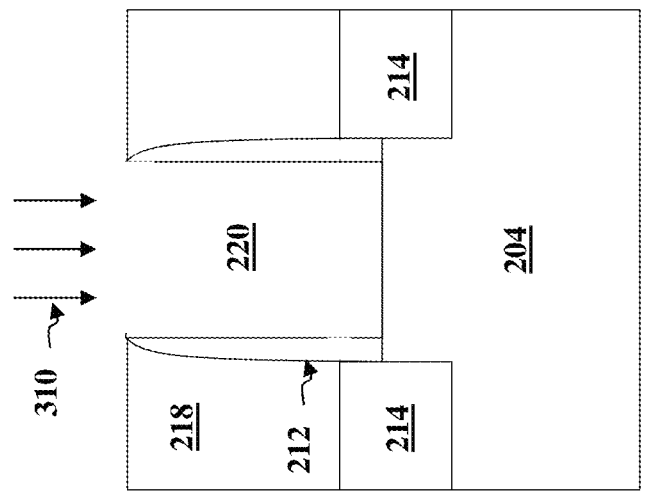
Figure 7:
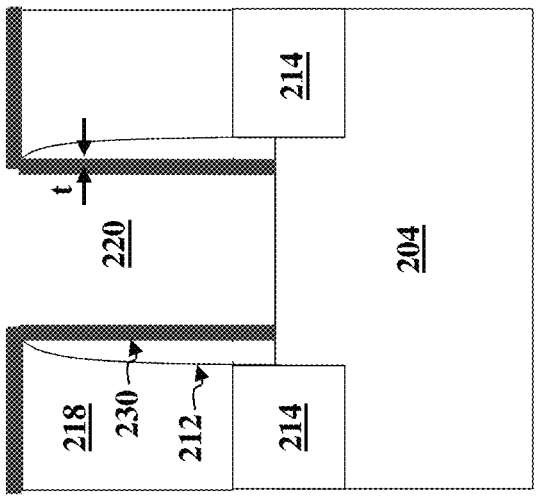

Referring to FIGS. 1, 6, and 7, the method 100 at operation 106 forms a sacrificial layer 230 over the gate spacers 212. The method 100 forms the sacrificial layer 230 in a selective manner over the gate spacers 212 such that the sacrificial layer 230 physically and/or chemically bonds with or grows on the gate spacers 212 (e.g., silicon nitride, silicon oxide, etc.) but not with or on the fin 204 or the epitaxial S/D features 214. In some embodiments, the sacrificial layer 230 is formed to a thickness t ranging from about 0.5 nm to about 1 nm. In some embodiments, as depicted in FIG. 6, the method 100 first implements a cleaning process 310 to prepare surfaces of the gate spacers 212 for the formation of the sacrificial layer 230. In some embodiments, the cleaning process 310 may be implemented using a wet agent such as hydrofluoric acid (HF). In the present disclosure, the cleaning process 310 is configured to functionalize the surfaces of the fin 204 with hydrogen-terminated (—H) groups and the surfaces of the gate spacers 212 with hydroxyl-terminated (—OH) groups. As such, chemical selectivity is established between the fin 204 and the gate spacers 212 to accommodate the selective deposition of the sacrificial layer 230.

In one example embodiment, the sacrificial layer 230 includes a polymer material in the form of a self-assembled monolayer (SAM) configured to provide various functional groups at surfaces of the gate spacers 212. In some examples, the SAM may include a sulfur-containing functional group (e.g., thiols), a silicon-containing group (e.g., silanes), an oxygen-containing group (e.g., hydroxyls), a methyl-containing group, or combinations thereof. The SAM may be formed by any suitable deposition process such as, for example, spread coating, chemisorption, PVD, electrodeposition, micro-contact printing, other suitable processes, or combinations thereof. In another example embodiment, the sacrificial layer 230 includes a layer of pristine graphene having a few, if any, structural defects. The layer of graphene may be formed by any suitable deposition process such as CVD. As provided herein, portions of the sacrificial layer 230 are configured to be removed at a later processing step.

In some embodiments, the method 100 may subsequently form various material layers in the gate trench 220. For example, referring to FIG. 8, the method 100 may form an interfacial layer 222 in the gate trench 220 to any suitable thickness. The interfacial layer 222 may be formed by any suitable method such as, for example, thermal oxidation, chemical oxidation, CVD, ALD, PVD, other suitable methods, or combinations thereof. Notably, due to the presence of the sacrificial layer 230 over the gate spacers 212, the interfacial layer 222 selectively bonds with or grows on the fin 204 but not on the sacrificial layer 230 (though the interfacial layer 222 is physically disposed adjacent to the sacrificial layer 230). In some embodiments, the interfacial layer 222 is omitted from the device 200.

Thereafter, the method 100 may proceed in one of two paths, Path A and Path B. The method 100 including Path A is discussed with reference to FIGS. 9A to 9D, while the method 100 including Path B is discussed with reference to FIGS. 14A to 14E. For purposes of clarity, numeric designations for components of the device 200 will remain the same during the discussion of Path A and Path B.

Figure 9B:
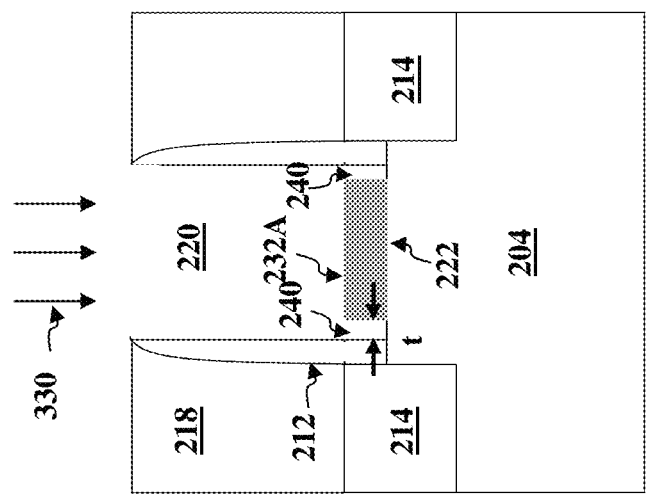
Figure 9A:
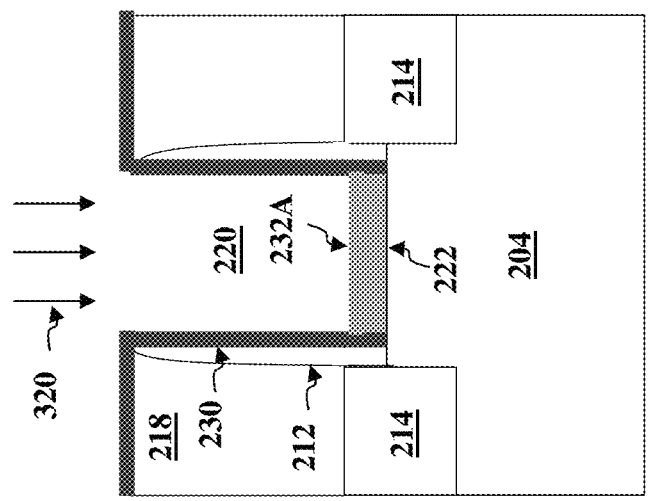

Referring to FIGS. 1 and 9A, the method 100 at operation 108A forms a Hf-containing layer 232A in the gate trench 220. Notably, as depicted herein, operation 108A simultaneously deposits the Hf-containing layer 232A over the fin 204 while applying an electric field 320 over the device 200. The Hf-containing layer 232A is selectively formed over the fin 204 (or any material layers formed thereover, such as the interfacial layer 222), as the sacrificial layer 230 includes surface termination groups not compatible for bonding with the Hf-containing layer 232A. In other words, the sacrificial layer 230 facilitates or guides the selective deposition of the Hf-containing layer 232A over portions of the fin 204 (or any material layers formed thereover) rather than over surfaces of the gate spacers 212.

The Hf-containing layer 232A includes a high-k dielectric material comprising hafnium (Hf) and oxygen (O) in the form of, for example, hafnium oxide (e.g., $HfO_2$). Therefore, in the present disclosure, the Hf-containing layer 232A may alternatively be referred to as the Hf-containing gate dielectric layer 232A. As discussed above, "high-k" refers to a dielectric material having a dielectric constant greater than that of silicon oxide, which is about 3.9. In some examples, an amount (by wt %) of $HfO_2$ included in the Hf-containing layer 232A ranges from about 30% to about 100%. In further embodiments, the Hf-containing layer 232A is doped with one or more dopant including, but not limited to, zirconium (Zr), aluminum (Al), lathanum (La), titanium (Ti), tantalum (Ta), silicon (Si), yttrium (Y), scandium (Sc), other suitable elements, or combinations thereof.

In the present embodiments, the Hf-containing layer 232A primarily includes amorphous $HfO_2$ rather than crystalline $HfO_2$, rendering the Hf-containing layer 232A having little to no ferroelectricity. Besides amorphous $HfO_2$, the Hf-containing layer 232A may also include a minute amount of microcrystals of $HfO_2$, which similarly does not exhibit ferroelectric behavior. In one example, the Hf-containing layer 232A may include more than about 90% (by weight) of amorphous $HfO_2$, and about 5% of the remainder may be crystalline $HfO_2$ in a monoclinic phase.

The Hf-containing layer 232A may be formed by any suitable deposition process including ALD, CVD, other processes, or combinations thereof. In some examples, the deposition of the Hf-containing layer 232A may be performed at a temperature ranging from about 150 degrees Celsius to about 500 degrees Celsius depending upon the specific layer thickness desired and/or if any dopant(s) is included. In some examples, the Hf-containing layer 232A may be formed at a gas pressure ranging from about 0.5 Torr to about 3 Torr depending upon the specific layer thickness desired and/or if any dopant(s) is included.

The Hf-containing layer 232A may optionally include other high-k dielectric material, such as alumina ($Al_2O_3$), zirconium oxide ($ZrO_2$), lanthanum oxide ($La_2O_3$), titanium oxide ($TiO_2$), yttrium oxide ($Y_2O_3$), other suitable high-k materials, or combinations thereof. In some embodiments, the Hf-containing layer 232A may include a perovskite material, such as lead zirconate titanate ($PbZr_xTi_{1-x}O_3$, or PZT, where $0 \leq x \leq 1$), barium titanate ($BaTiO_3$), barium strontium titanate ($BaSrTiOx$, or BST), strontium titanate ($SrTiO_3$), other suitable perovskite materials, or combinations thereof that are configured to undergo phase transition to acquire ferroelectric behavior.

Figure 10A:
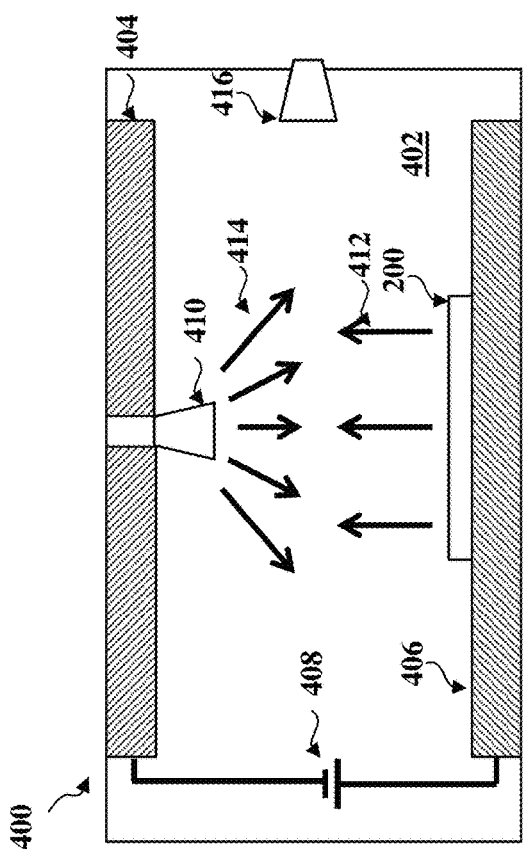
FIGS. 10A and 10B illustrate embodiments of an example apparatus in accordance with some embodiments of the present disclosure.
Figure 10B:
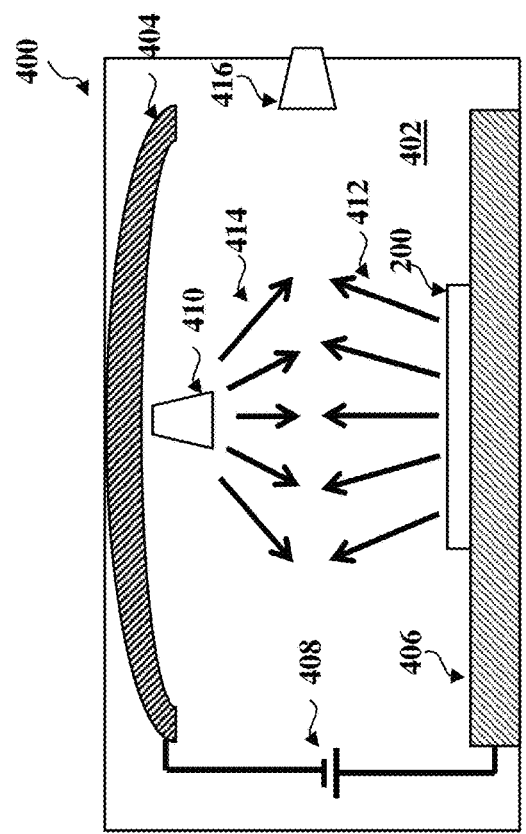

Still referring to FIG. 9A, the in-situ application of the electric field 320 may be performed in the same chamber as the deposition process implemented at operation 108A. Referring to FIGS. 10A and 10B, a deposition apparatus 400 is provided as an example embodiment in which the deposition of the Hf-containing layer 232A and/or the application of the electric field 320 is implemented.

The deposition apparatus 400 includes a chamber 402 configured with two electrodes: a top electrode 404 and a bottom electrode 406. In some embodiments, the bottom electrode 406 includes an electrostatic chuck (or E-chuck) upon which the device 200 is disposed. Alternatively or additionally, the bottom electrode 406 may include a susceptor, which is configured to heat the device 200 disposed thereon to an elevated temperature using, for example, infrared radiation. In some embodiments, referring to FIG. 10A, the top electrode 404 and the bottom electrode 406 are configured to be substantially parallel. However, the present disclosure is not limited to this configuration and may also be applicable in instances where the top electrode 404 and/or the bottom electrode 406 is configured with a curvature (e.g., FIG. 10B), such as in a concave, convex, spiral, or other suitable configurations. In some examples, spacing between the top electrode 404 and the bottom electrode 406 ranges from about 5 cm to about 50 cm; though other spacings may also be applicable in order to accommodate different configurations and sizes of the deposition apparatus 400. The top electrode 404 and the bottom electrode 406 may include any suitable metal or ceramic materials operable to be heated to a desired temperature (e.g., from about 150 degrees Celsius to about 500 degrees Celsius as discussed above). The deposition apparatus 400 may further include a gas inlet 416 and a gas outlet (not depicted) for providing one or more gas, inert or otherwise, during deposition, temperature monitoring device(s), and/or other suitable components. In some examples, gases such as nitrogen ($N_2$), argon (Ar), ammonia ($NH_3$), oxygen ($O_2$), other suitable gases, or combinations thereof may be provided to the chamber 402 via the gas inlet 416.

Referring to both FIGS. 10A and 10B, the top electrode 404 and the bottom electrode 406 are coupled to a power source 408, which may be disposed inside the chamber 402 as depicted herein or, alternatively, disposed outside the chamber 402. When the power source 408 is switched on, the top electrode 404 and the bottom electrode 406 may be oppositely charged such that an electric field 412 (e.g., the electric field 320) is established therebetween. For embodiments in which the top electrode 404 and the bottom electrode 406 are substantially parallel to each other (FIG. 10A), a direction of the electric field 412 may be substantially unidirectional, such as substantially perpendicular to both the top electrode 404 and the bottom electrode 406. Alternatively, referring to FIG. 10B, the direction of the electric field 412 may be multidirectional, i.e., the electric field 412 does not align along a single direction. In the present disclosure, the electric field 320 is substantially unidirectional and may be substantially perpendicular to a top surface of the device 200 disposed over the bottom electrode 406. In some embodiments, the electric field 412 is a direct-current (DC) electric field. In alternative embodiments, the electric field 412 is an alternating-current (AC) electric field. Furthermore, the polarity of the electrodes 404 and 406 may be reversed for applications of the present disclosure. In some examples, the voltage supplied by the power source 408 is from about 2 kV to about 10 kV; though other voltage may also be applicable in the present disclosure. During the deposition process 250, a source material 414 is discharged into the chamber 402 through a dispensing unit 410 and deposited on the device 200 (e.g., in the gate trench 220). In the depicted embodiment, the source material 414 includes one or more precursor gas suitable for forming $HfO_2$. However, the present disclosure is not limiting with respect to the kinds of precursor gas that may be used herein. For example, the precursor gas may include an Hf-containing metalorganic gas, an Hf-containing halide gas, other suitable gases, or combinations thereof.

In the present embodiments, the in-situ application of the electric field 320 and the deposition of the Hf-containing layer 232A provides energy to mobilize oxygen atoms relative to hafnium atoms toward lattice positions consistent with the ferroelectric orthorhombic crystal structure. In some instances, energy provided by the electric field 320 may be utilized to control the amount of oxygen vacancies present in the crystal structure. In some embodiments, a suitable amount of oxygen vacancies helps facilitate the phase transition to crystalline phases with high symmetry, such as orthorhombic phase, during a subsequent annealing process and induce metastable polar phases to form at the boundary of such phases. However, an excessive amount of oxygen vacancies may instead favor less symmetric crystalline phases that do not exhibit ferroelectric properties. As a result, though not required, it may offer advantage for the overall yield of the ferroelectric orthorhombic phase to apply an electric field during the deposition of the Hf-containing layer 232A, resulting in a Hf-containing layer with microstructures different (e.g., having less oxygen vacancies) from those of an Hf-containing layer not deposited with in-situ application of an electric field. Though not required by the present disclosure, elements such as nitrogen (N) (e.g., in the form of an inert gas provided during operation 108A) may passivate the oxygen vacancies, further promoting the phase transformation as discussed herein.

It is noted, however, that the energy provided by the electric field 320 during the deposition process at the operation 108A is generally not sufficient to complete the transformation of amorphous $HfO_2$ to ferroelectric orthorhombic crystalline $HfO_2$, and a subsequent annealing process may be needed to facilitate such transformation. Additionally, as will be discussed with respect to Path B, the present disclosure does not require the in-situ application of an electric field during the deposition of the Hf-containing layer 232A; instead, an electric field may be applied alternatively or additionally at a later stage during the method 100 to achieve enhanced transformation of amorphous $HfO_2$ to ferroelectric orthorhombic $HfO_2$.

Thereafter, referring back to FIGS. 1 and 9B, the method 100 at operation 110 removes the sacrificial layer 230 to form a trench 240. In the depicted embodiment, the trench 240, having a width substantially equivalent to the thickness t of the sacrificial layer 230, is disposed between the Hf-containing layer 232A and a sidewall of the gate spacers 212. In some embodiments, the sacrificial layer 230 is removed by a wet etching process 330. In some embodiments, implementing the wet etching process 330 includes applying an etchant that includes solvent such as sulfuric acid, hydrogen peroxide, other suitable solvents, or combinations thereof.

Referring to FIGS. 1 and 9C, the method 100 at operation 112A forms an Hf-containing layer 232B over the device 200. Specifically, the method 100 forms a first portion of the Hf-containing layer 232B over the Hf-containing layer 232A and a second portion of the Hf-containing layer 232B in the trench 240. In the present embodiments, the method 100 forms the Hf-containing layer 232B by implementing an ALD process. In the depicted embodiment, the Hf-containing layer 232A and the Hf-containing layer 232B include substantially the same material (e.g., amorphous $HfO_2$) and are therefore together referred to as Hf-containing layer 233 having a thickness T that is greater than the thickness t. In the depicted embodiment, the thickness T ranges from about 1 nm to about 3 nm. Notably, if T is less than about 1 nm, current leakage of the HKMG 210 may be too high, adversely affecting the performance of the device 200. On the other hand, if T is greater than about 3 nm, dimensions of subsequently formed layers over the Hf-containing layer 233 may be negatively affected, e.g., less available space for forming a bulk conductive layer of the HKMG 210. In some examples, a ratio of T to t may be at least about 3. Although the present disclosure is not limited to such ratio, it is generally desirable to minimize the thickness t (i.e., maximizing the ratio of T to t) to an extent allowable by the capacity of the processing tool(s) because a thinner HF-containing layer 232B may lead to greater reduction in parasitic capacitance of the device 200. In some instances, if the ratio of T to t is less than about 3, the extent of reduction in parasitic capacitance may be negligible. Due to the removal of the sacrificial layer 230, the Hf-containing layer 232B is formed over both the Hf-containing layer 232A and sidewalls of the gate spacers 212 while filling up the trench 240. As a result, the Hf-containing layers 232A and 232B include a high-k dielectric material, such as $HfO_2$, with controlled oxygen vacancies suitable for facilitating the transformation of amorphous $HfO_2$ to crystalline ferroelectric orthorhombic $HfO_2$.

In some embodiments, the Hf-containing layer 232B is formed by simultaneously depositing an Hf-containing material (e.g., $HfO_2$) and applying an electric field 340. The process of forming the Hf-containing layer 232B may be similar to the process of forming the Hf-containing layer 232A at operation 108A. For example, referring back to FIGS. 10A and 10B, the Hf-containing layer 232B may be formed in an apparatus similar to the deposition apparatus 400, in which a source material for $HfO_2$ is discharged into the chamber 402 through a dispensing unit 410 toward the substrate (e.g., the device 200). The application of the electric field 340 may be implemented by switching on the power source 408 to charge the top electrode 404 and the bottom electrode 406 with opposite charges, thereby establishing an electric field therebetween. The direction of the electric field 340 may be unidirectional or multidirectional with respect to the device 200. In some embodiments, the direction and strength (i.e., the magnitude) of the electric field 340 is substantially the same as those of the electric field 320 as discussed above.

Notably, still referring to FIG. 9C, the relative dimensions (e.g., a ratio) of the thickness t and a thickness H, which is a thickness of the Hf-containing layer 233 and the interfacial layer 222 combined, may be used to determine a specific means of deposition process that may be implemented at operation 112A. For example, if the ratio of the thickness H to the thickness t is less than about 4, then a deposition process such as ALD may be used to form the Hf-containing layer 232B. For ratios that are greater than about 4, both ALD and CVD may be implemented to form the Hf-containing layer 232B. Of course, regardless of the specific means of deposition, the deposition apparatus 400 depicted in FIGS. 10A and 10B is generally applicable to the present embodiments to ensure simultaneous deposition of an Hf-containing material and application of an electric field.

Thereafter, referring to FIGS. 1 and 9D, the method 100 at operation 114 performs an annealing process with an in-situ application of an electric field 350 to the device 200. As will be discussed below, the annealing process implemented at operation 114 alters the structure of the $HfO_2$ included in the Hf-containing layers 232A and 232B to form a Hf-containing layer 234 disposed over the device 200. In the present disclosure, the Hf-containing layer 234 includes a first portion 234A (or Hf-containing layer 234A) that corresponds to the Hf-containing layer 233 disposed over the fin 204 and a second portion 234B (or Hf-containing layer 234B) that corresponds to the second portion of the Hf-containing layer 232B disposed over the gate spacers 212 (see FIG. 9C).

Figure 10C:
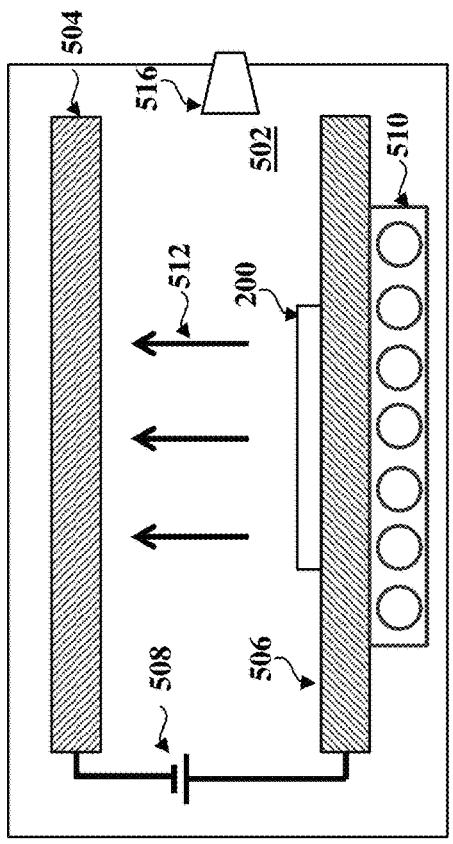
FIGS. 10C and 10D illustrate embodiments of an example apparatus in accordance with some embodiments of the present disclosure.
Figure 10D:
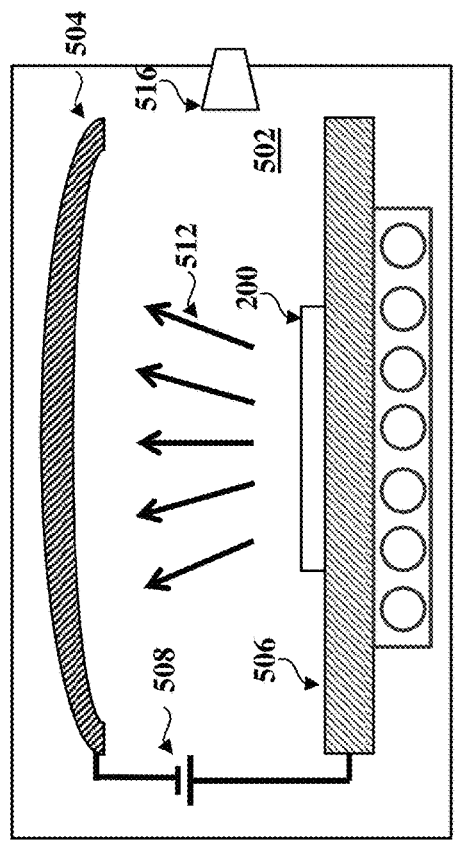

In some embodiments, the method 100 at operation 114 performs the annealing process in an annealing apparatus 500 as depicted in FIGS. 10C and 10D. The annealing apparatus 500 includes a chamber 502 configured with two electrodes: a top electrode 504 and a bottom electrode 506, which may be similar in configuration and/or in material composition as the top electrode 404 and the bottom electrode 406 discussed above with respect to the deposition apparatus 400. For example, the top electrode 504 and the bottom electrode 506 may be configured to be substantially parallel as depicted in FIG. 10C or, alternatively, the top electrode 504 and/or the bottom electrode 506 may be configured with a curvature as depicted in FIG. 10D. The annealing apparatus 500 may additionally or alternatively include a heating source 510 disposed below and in contact with the bottom electrode 506. The heating source 510 may include a susceptor as discussed above configured to heat the device 200 disposed thereover to an elevated temperature during the annealing process. In some embodiments, the bottom electrode 506 and the heating source 510 may be a single, unified component. Alternatively, the bottom electrode 506 and the heating source 510 may be configured to be separate components. The annealing apparatus 500 may include additional components, such as a gas inlet 516, which may be similar to the gas inlet 416 depicted in FIGS. 10A and 10B, and a gas outlet (not depicted), other suitable components, or combinations thereof. Gases such as nitrogen ($N_2$), argon (Ar), ammonia ($NH_3$), other suitable gases, or combinations thereof may be applied to the device 200 during the annealing process.

Similar to the descriptions of FIGS. 10A and 10B, the top electrode 504 and the bottom electrode 506 are coupled to a power source 508. When the power source 508 is switched on, the top electrode 504 and the bottom electrode 506 may be oppositely charged such that an electric field 512 is established therebetween. In some embodiments, the electric field 350 is a direct-current (DC) electric field. In alternative embodiments, the electric field 350 is an alternating-current (AC) electric field. Furthermore, the polarity of the electrodes 504 and 506 may be reversed for applications of the present disclosure. In some examples, the voltage supplied by the power source 508 is from about 2 kV to about 10 kV; though other voltage may also be applicable in the present disclosure. For embodiments in which the top electrode 504 and the bottom electrode 506 are substantially parallel to each other (FIG. 10C), a direction of the electric field 350 may be substantially unidirectional, such as substantially perpendicular to both the top electrode 504 and the bottom electrode 506. Alternatively, referring to FIG. 10D, the direction of the electric field 350 may be multidirectional, i.e., the electric field 350 does not align along a single direction.

In some embodiments, the mode by which the method 100 performs the annealing process is not limiting so long as it provides sufficient energy to enable the transformation of amorphous $HfO_2$ to ferroelectric orthorhombic crystalline $HfO_2$. For example, the annealing process may be a furnace annealing process, a rapid thermal annealing (RTA) process, a spike annealing process, a laser annealing process, other suitable annealing process, or combinations thereof. In an example embodiment, the annealing process is an RTA process. In some embodiments, the annealing temperature implemented during the annealing process ranges from about 600 degrees Celsius to about 1000 degrees Celsius. If the annealing temperature falls below about 600 degrees Celsius, the thermal energy available for completing the phase transformation may not be sufficient. On the other hand, if the annealing temperature is above about 1000 degrees Celsius, excessive heat may damage other components (e.g., S/D features, etc.) of the device 200. The annealing process may be implemented for any suitable amount of time depending upon a specific annealing process employed. For example, if a high-temperature annealing process, such as a laser annealing process, is employed, the annealing time may be on the order of microseconds. On the other hand, if a low-temperature annealing process, such as a furnace annealing process, is employed, the annealing time may be on the order of tens of minutes.

As discussed above, the deposition of the Hf-containing layer 232A at operation 108A may not necessarily be accompanied by the in-situ application of the electric field 320. At operation 114, however, the method 100 applies the electric field 350 while performing the annealing process. In some embodiments, parameters for implementing the electric field 350 are similar to those for implementing the electric field 320. For example, the direction and strength (i.e., the magnitude) of the electric field 350 are substantially the same as those of the electric field 320. In other embodiments, the electric field 350 may be implemented at a higher magnitude than the electric field 320. As discussed above, applying the electric field 320 during deposition of $HfO_2$ at operation 108A provides energy for structural rearrangement of atoms within the structure of $HfO_2$. One result of such rearrangement includes reduction in the number of oxygen vacancies present in $HfO_2$. However, the simultaneous application of the electric field 350 during the annealing process at operation 114 generally serves a purpose different from that of the electric field 320 applied during the deposition process at operation 108A. As stated previously, the activation energy required (i.e., energy barrier that must be overcome) for the crystallization of the ferroelectric orthorhombic phase increases as thickness of the high-k gate dielectric layer decreases. For at least this reason, thermal annealing alone, carried out at a temperature (from about 600 degrees Celsius to about 1000 degrees Celsius) high enough without causing damage to other components of the device, falls short in converting amorphous $HfO_2$ to ferroelectric orthorhombic $HfO_2$. In the present disclosure, the simultaneous application of the electric field 350 during the annealing process is configured to overcome the activation energy required for crystallizing or transforming amorphous $HfO_2$ in the Hf-containing layers 234A and 234B to a ferroelectric orthorhombic phase (i.e., $Pca2_1$ phase) of $HfO_2$. In an example embodiment, the amount of ferroelectric orthorhombic phase obtained following the annealing process is at least about 60% by weight. In some embodiments, after the annealing process at operation 114, the electric dipoles within the Hf-containing layers 234A and 234B are oriented in substantially the same direction. In further embodiments, a domain size of the ferroelectric Hf-containing material in the Hf-containing layers 234A and 234B is larger than the thickness t.

FIG. 11 is a schematic illustration of the effect of applying an electric field (e.g., the electric field 350) on the activation energy required for phase transformation during the annealing process. As activation energy is plotted against polarization in the depicted graph, the activation energy 610 at the peak of the graph reflects the amount of energy needed to overcome the barrier for forming the ferroelectric orthorhombic phase of $HfO_2$ without applying any electric field. On the other hand, the activation energy 620 represents the energy barrier against forming the ferroelectric orthorhombic phase of $HfO_2$ when an electric field, such as the electric field 350, is applied during the annealing process. Notably, the activation energy 620 is less than the activation energy 610, indicating a lowered energy barrier for forming the ferroelectric orthorhombic phase of $HfO_2$. In other words, although the chemical composition of the Hf-containing layer 234 is the same as that of the Hf-containing layers 232A and 232B, the Hf-containing layer 234 has a higher ferroelectricity in comparison to the Hf-containing layers 232A and 232B. In some examples, the activation energy 620 may be reduced to about 20% to about 25% of the activation energy 610, thereby increasing the efficiency of $HfO_2$ transformation.

Figure 12:
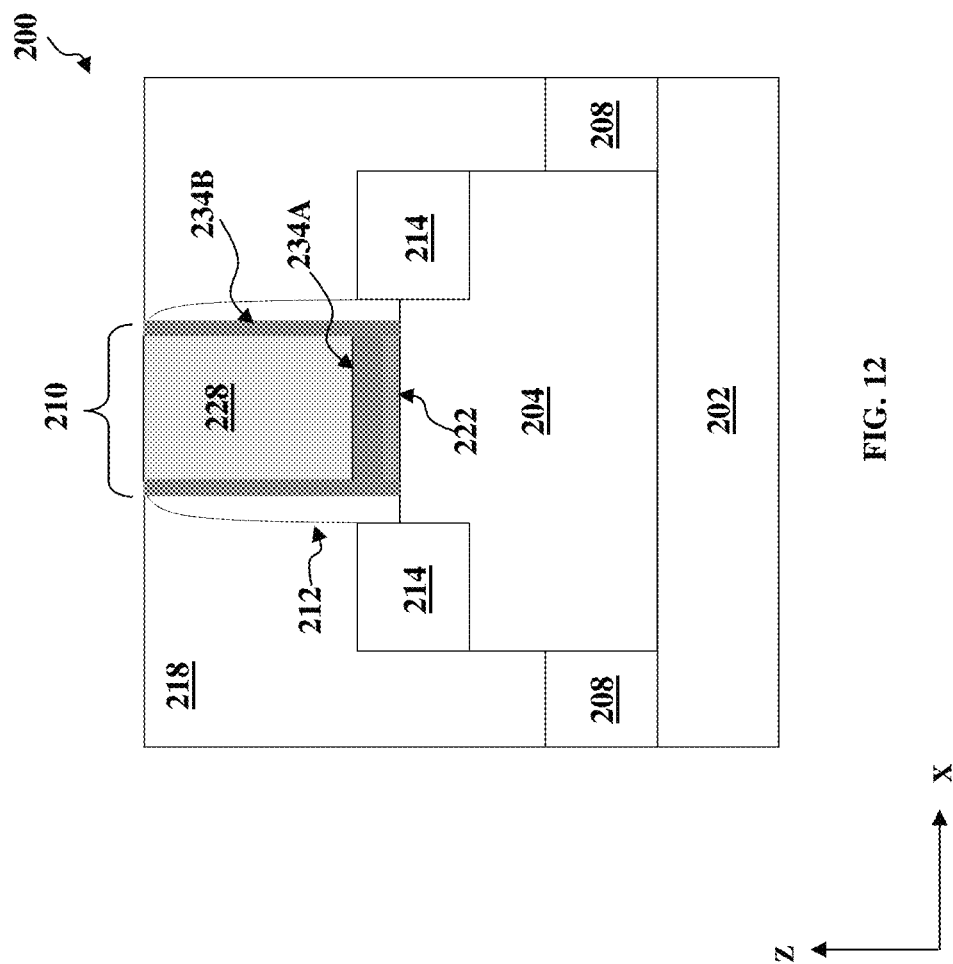
Figure 13:
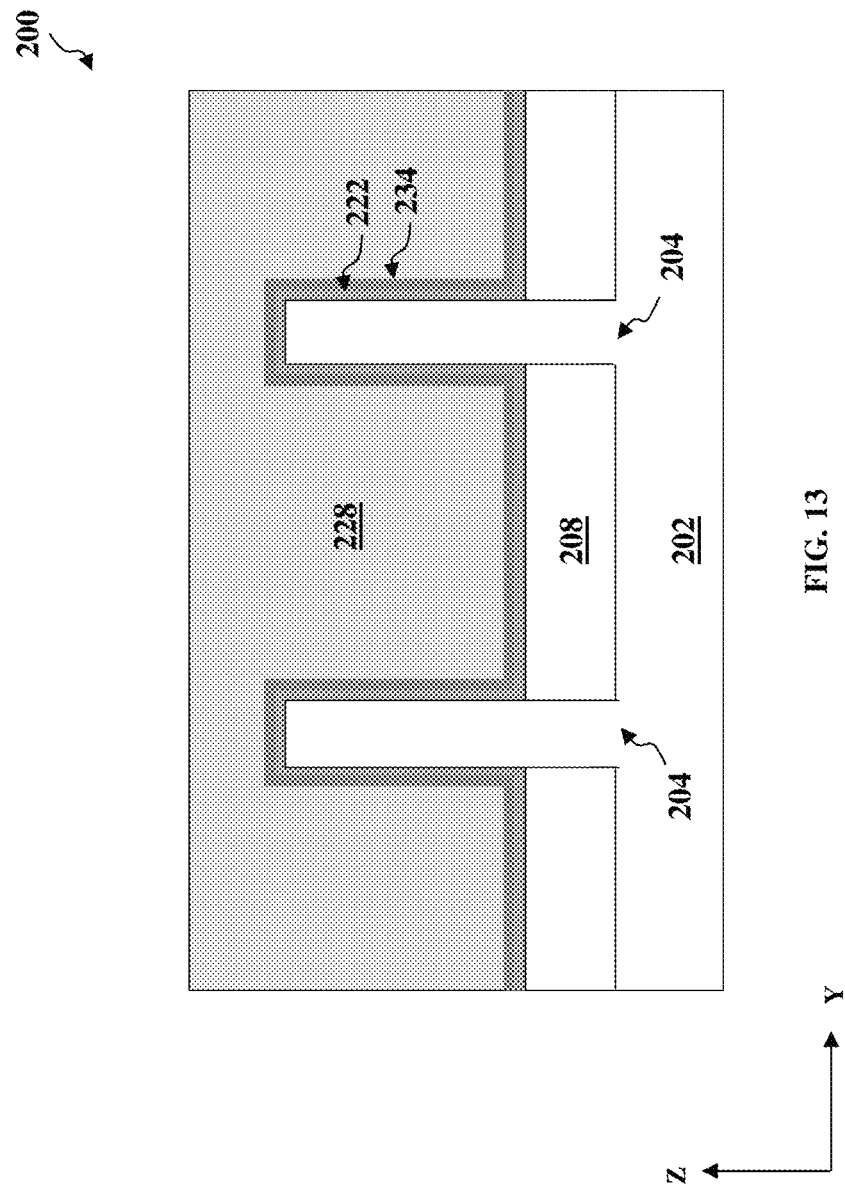

Now referring to FIGS. 1, 12, and 13, the method 100 at operation 116 forms a metal gate electrode 228 over the Hf-containing layer 234, thereby completing the formation of the HKMG 210. Though not depicted, in some embodiments, forming the metal gate electrode 228 includes forming various material layers such as a barrier layer, a capping layer, other suitable material layers, or combinations thereof over the Hf-containing layer 234. In some examples, the barrier layer may include titanium nitride (TiN), tantalum nitride (TaN), other suitable materials, or combinations thereof, and the capping layer may include TiN, TaN, titanium silicide (TiSi), other suitable materials, or combinations thereof, both of which may be formed by any suitable method, such as CVD, ALD, PVD, other suitable methods, or combinations thereof.

Thereafter, the method 100 deposits one or more work function metal layer over the Hf-containing layer 234. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same (i.e., all n-type work function metals or all p-type work function metal) or different types in order to achieve a desired threshold voltage. For example, the work function metal layer may include an n-type work function metal layer formed over a p-type work function metal layer (or vice versa). The work function metal layer may be formed by any suitable method, such as CVD, ALD, PVD, other suitable methods, or combinations thereof.

Subsequently, the method 100 forms a bulk conductive layer over the one or more work function metal layer. The bulk (or fill) conductive layer may include aluminum (Al), copper (Cu), tungsten (W), cobalt (Co), ruthenium (Ru), other suitable conductive materials, or combinations thereof, and may be formed by any suitable method, such as CVD, ALD, PVD, plating, other suitable methods, or combinations thereof. Thereafter, the method 100 may perform one or more polishing process (e.g., CMP) to remove any excess conductive materials and portions of the Hf-containing layer 234B formed over the ILD layer 218 to planarize the top surface of the device 200.

The method 100 at operation 116 may also form other material layers. For example, the method 100 may form a hard mask layer before forming the work function metal layer to accommodate patterning of the work function metal layer. The hard mask layer may include any suitable material, such as a titanium-containing material, a tantalum-containing material, a nitrogen-containing material, a silicon-containing material, other suitable materials, or combinations thereof. The hard mask layer may, for example, include titanium nitride (TiN), tantalum nitride (TaN), titanium silicide (TiSi), and/or other suitable materials. The hard mask layer may be formed by any suitable deposition process (e.g., ALD). The method 100 may additionally form a glue (or adhesive) layer (not depicted) before forming the bulk conductive layer. In some embodiments, the glue layer is configured to prevent peeling of the bulk conductive layer (e.g., a W-containing bulk conductive layer). The glue layer may include a titanium-containing material, a tantalum-containing material, a tungsten-containing material, a nitrogen-containing material, other suitable materials, or combinations thereof. The glue layer may be formed by any suitable method (e.g., CVD, ALD, PVD, etc.).

Referring to FIG. 1, the method 100 at operation 118 may perform additional processing steps. For example, additional vertical interconnect features such as contacts and/or vias, and/or horizontal interconnect features such as lines, and multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Figure 14B:
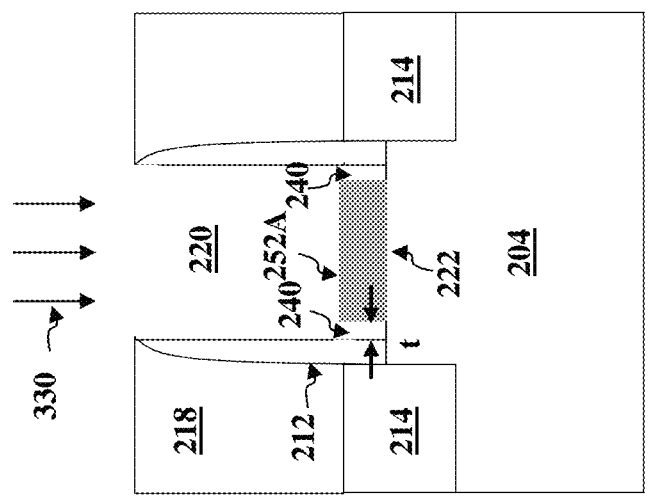
Figure 14A:
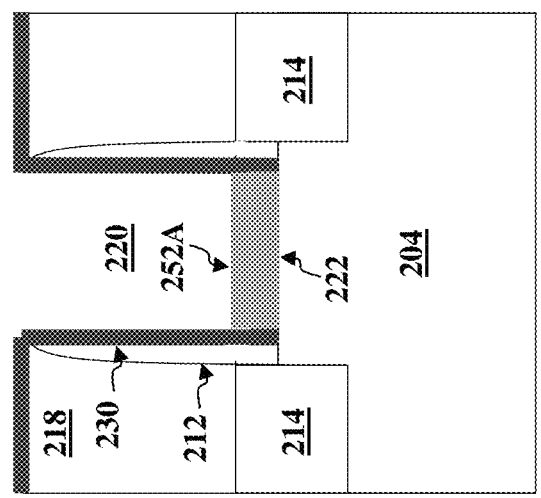

Now referring back to FIG. 1 and collectively to FIGS. 14A-14E, the method 100 may alternatively proceed in Path B after forming the sacrificial layer 230. Referring to FIG. 14A, the method 100 at operation 108B forms a Hf-containing layer 252A over the fin 204 in the gate trench 220. Similar to the process of forming the Hf-containing layer 232A at operation 108A, the Hf-containing layer 252A is selectively formed over the fin 204 in a process facilitated by the sacrificial layer 230. In some embodiments, the Hf-containing layer 252A has a chemical composition substantially similar to that of the Hf-containing layer 232A. For example, the Hf-containing layer 252A may include a high-k dielectric material comprising hafnium (Hf) and oxygen (O) in the form of, for example, amorphous hafnium oxide (e.g., $HfO_2$) and may optionally be doped with one or more dopant such as, for example, Zr, Al, La, Ti, Ta, Si, Y, Sc, other suitable elements, or combinations thereof. The Hf-containing layer 252A may be formed by any deposition process including ALD, CVD, other suitable processes, or combinations thereof.

Notably, while the Hf-containing layer 252A and the Hf-containing layer 232A include substantially similar chemical compositions and are both substantially amorphous in nature, the microstructure of the Hf-containing layer 252A may differ from that of the Hf-containing layer 232A. This may be a result of the in-situ application of the electric field 320 during the forming of the Hf-containing layer 232A. As discussed earlier, the in-situ application of the electric field 320 provides energy to mobilize oxygen atoms relative to hafnium atoms toward lattice positions consistent with the ferroelectric orthorhombic crystal structure, making the microstructure favorable for transforming amorphous $HfO_2$ into ferroelectric orthorhombic $HfO_2$ when thermal annealing is applied. In comparison, the $HfO_2$ in the Hf-containing layer 252A lacks or substantially lacks the microstructure having an amount of oxygen vacancies favorable for phase transformation due to a lack of applied in-situ electric field. As such, in some examples, the Hf-containing layer 232A includes less oxygen vacancies than the Hf-containing layer 252A.

Referring to FIGS. 1 and 14B, the method 100 at operation 110 removes the sacrificial layer 230 from the device 200 in a process similar to that discussed above with reference to FIG. 9B. For example, the method 100 at operation 110 may perform a wet etching process 330 utilizing HF to remove the sacrificial layer 230. As discussed above, the removal of the sacrificial layer 230 forms trench 240 having a width t disposed between the Hf-containing layer 252A and the gate spacers 212.

Figure 14D:
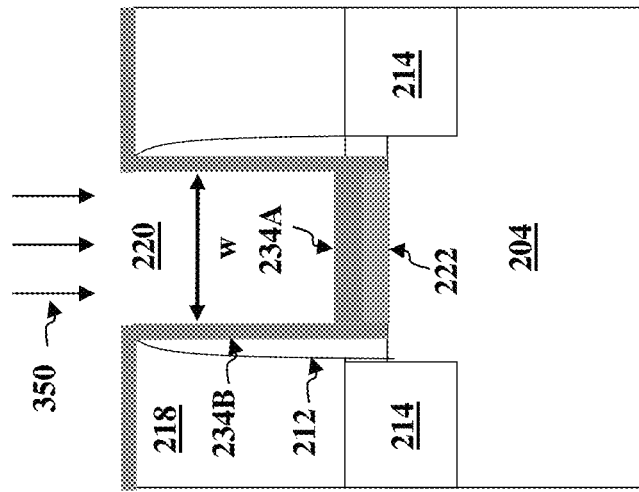
Figure 14C:
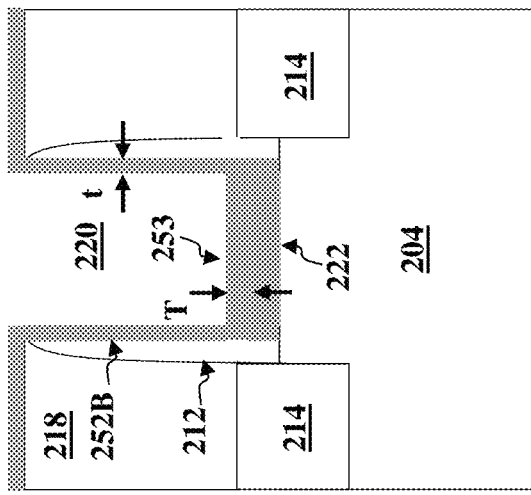

Thereafter, referring to FIGS. 1 and 14C, the method 100 at operation 112B deposits a first portion of the Hf-containing layer 252B over the Hf-containing layer 252A and a second portion of the Hf-containing layer 252B on sidewalls of the gate spacers 212. In the depicted embodiment, the Hf-containing layer 252A and the first portion of the Hf-containing layer 252B are together referred to as Hf-containing layer 253. As depicted herein, the thickness t of the Hf-containing layer 252B is substantially equivalent to the width t of the trench 240. The deposition process at operation 112B may be similar to that discussed above with respect to operation 112A; however, unlike at operation 112A, no in-situ electric field is applied at operation 112B. The Hf-containing material may be deposited by any deposition process such as ALD, CVD, other suitable processes, or combinations thereof. As such, microstructure of the Hf-containing material in the Hf-containing layers 252A and 252B differs from that in the Hf-containing layers 232A and 232B for reasons similar to those discussed above with respect to operation 108B.

Referring to FIGS. 1 and 14D, the method 100 at operation 114 performs an annealing treatment while applying an electric field 350 to the device 200. In some embodiments, the method 100 at operation 114 transforms amorphous $HfO_2$ included in the Hf-containing layer 253 and the Hf-containing layer 252B into ferroelectric orthorhombic $HfO_2$ to form the Hf-containing layers 234A and 234B, respectively. In some embodiments, the method 100 implements operation 114 in a manner substantially similar to that discussed above with reference to FIG. 9D (i.e., at Path A).

Notably, the thickness T of the Hf-containing layer 234A is greater than the thickness t of the Hf-containing layer 234B. In the depicted embodiment, the thickness T is about 1 nm to about 3 nm similar to that discussed above. In some examples, a ratio of T to t may be at least 3. Of course, the present disclosure is not limited to such ratio. In some instances, it may be desirable to minimize the thickness t (i.e., maximizing the ratio of T to t) to an extent allowable by the capacity of the processing tool(s) as discussed above. As such, because the thickness of the Hf-containing layer 234B is less than the thickness of the Hf-containing layer 234A, parasitic capacitance on the spacers 212 is effectively reduced. Furthermore, reduced thickness of the Hf-containing layer 234B enlarges a width w of the gate trench 220, thus enabling the formation of a larger gate electrode (e.g., subsequently formed gate electrode 228) with reduced resistance and/or improved tuning of threshold voltage.

Figure 14E:
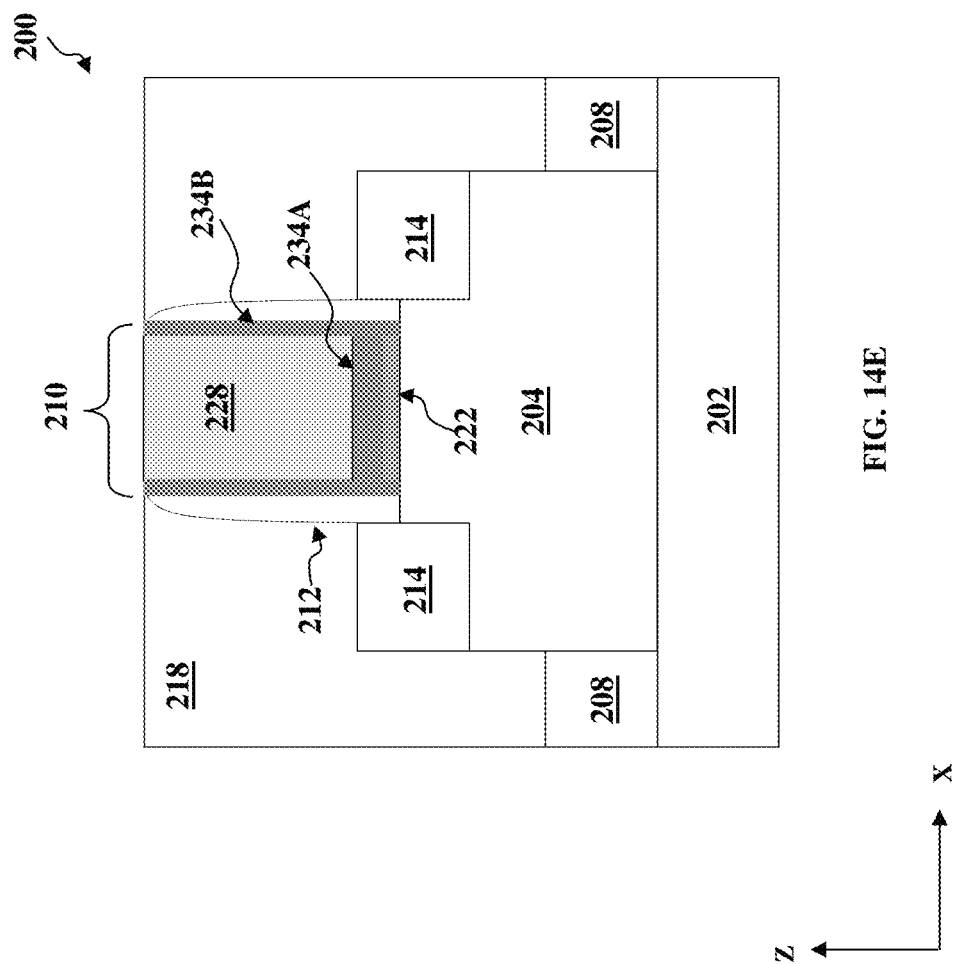

Referring to FIGS. 1 and 14E, the method 100 at operation 116 forms the metal gate electrode 228 over the Hf-containing layers 234A and 234B, completing the formation of the HKMG 210 in a manner substantially similar to the discussion above with respect to FIG. 12. For example, forming the metal gate electrode 228 may include forming various material layers such as a barrier layer, a capping layer, at least one work function metal layer, a bulk conductive layer, other suitable material layers, or combinations thereof over the Hf-containing layers 234A and 234B. The various material layers of the metal gate electrode 228 may be formed by any suitable method including CVD, ALD, PVD, plating, other suitable methods, or combinations thereof. A CMP process may be performed after forming the metal gate electrode 228 to planarize the top surface of the device 200 (e.g., removing portions of the Hf-containing layer 234B formed over the ILD layer 218). Thereafter, the method 100 at operation 118 performs additional processing steps such as forming a variety of interconnect features over the device 200 as discussed in detail above.

Although not intended to be limiting, one or more embodiments of the present disclosure provide many benefits to a semiconductor device and the formation thereof. The present disclosure provides methods of forming an HKMG in an FET such as an NCFET. In some embodiments, the HKMG includes a ferroelectric Hf-containing (e.g., $HfO_2$-containing) high-k gate dielectric layer fabricated by a series of deposition and annealing processes. Particularly, methods of transforming amorphous $HfO_2$-containing dielectric material to ferroelectric orthorhombic $HfO_2$-containing dielectric layer (i.e., including the Pca21 phase) include simultaneously applying an electric field during a deposition and/or a post-deposition annealing process. In addition, embodiments of the present disclosure are also directed to methods of reducing sidewall thickness of the ferroelectric Hf-containing high-k gate dielectric layer in NCFETs. Embodiments provided herein improve the overall performance of devices such as NCFETs by promoting formation of ferroelectric Hf-containing gate dielectric layer, reducing parasitic capacitance between the HKMG and gate spacers, enlarging processing window for tuning threshold voltage, and reducing overall gate resistance of the devices.

In one aspect, the present disclosure provides a method that begins with forming a sacrificial layer on sidewalls of gate spacers disposed over a semiconductor layer. The method then proceeds to forming a first hafnium-containing gate dielectric layer over the semiconductor layer in a first trench disposed between the gate spacers, removing the sacrificial layer to form a second trench between the gate spacers and the first hafnium-containing gate dielectric layer, and subsequently forming a second hafnium-containing gate dielectric layer over the first hafnium-containing gate dielectric layer and on the sidewalls of the gate spacers. Then, the method proceeds to annealing the first and the second hafnium-containing gate dielectric layers while simultaneously applying an electric field, and subsequently forming a gate electrode over the annealed first and second hafnium-containing gate dielectric layers.

In another aspect, the present disclosure provides a method that begins with removing a dummy gate stack disposed over a semiconductor layer and interposed between gate spacers to form a first trench and forming a sacrificial layer on sidewall surfaces of the gate spacers. After forming the sacrificial layer, the method proceeds to depositing a hafnium-containing dielectric material over the semiconductor layer to form a first gate dielectric layer, where the depositing includes applying a first electric field. After forming the first gate dielectric layer, the method proceeds to removing the sacrificial layer to form a second trench and subsequently depositing the hafnium-containing dielectric material in the second trench and on the sidewall surfaces of the gate spacers to form a second gate dielectric layer, where the depositing includes applying a second electric field. Thereafter, the method proceeds to applying an annealing treatment to the first and the second gate dielectric layers, where the applying increases degree of ferroelectricity of the first and the second gate dielectric layers. After applying the annealing treatment, the method proceeds to forming a metal gate electrode over the first and the second gate dielectric layers.

In yet another aspect, the present disclosure provides a semiconductor structure that includes gate spacers disposed over a semiconductor layer, a hafnium-containing dielectric layer, and a metal gate electrode disposed over the hafnium-containing dielectric layer and between the gate spacers. With respect to the hafnium-containing dielectric layer, the present disclosure provides that a first portion of the hafnium-containing dielectric layer having a first thickness is disposed over the semiconductor layer and a second portion of the hafnium-containing dielectric layer having a second thickness is disposed on sidewalls of the gate spacers, where the first thickness is greater than the second thickness.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    removing a dummy gate stack to form a first trench between gate spacers, wherein the first trench exposes a semiconductor layer;
    forming a sacrificial layer along sidewalls of the gate spacers in the first trench, wherein the semiconductor layer is exposed in the first trench between portions of the sacrificial layer;
    forming a first hafnium-containing gate dielectric layer along the semiconductor layer but not along the sacrificial layer in the first trench;
    removing the sacrificial layer to form a second trench within the first trench, wherein a first sidewall of the second trench is defined by one of the gate spacers and a second sidewall of the second trench is defined by the first hafnium-containing gate dielectric layer;
    forming a second hafnium-containing gate dielectric layer over the first hafnium-containing gate dielectric layer and along the sidewalls of the gate spacers to fill the second trench;
    annealing the first and the second hafnium-containing gate dielectric layers, wherein the annealing includes simultaneously applying an electric field; and
    forming a gate electrode over the annealed first and second hafnium-containing gate dielectric layers.

2. The method of claim 1, wherein forming the sacrificial layer includes selectively depositing the sacrificial layer along the sidewalls of the gate spacers but not along the semiconductor layer.

3. The method of claim 1, wherein forming the sacrificial layer includes forming a layer of graphene.

4. The method of claim 1, further comprising forming an interfacial layer over the semiconductor layer after forming the sacrificial layer and before forming the first hafnium-containing gate dielectric layer.

5. The method of claim 1, wherein the electric field is a first electric field, and wherein forming the first hafnium-containing gate dielectric layer includes simultaneously applying a second electric field.

6. The method of claim 1, wherein the electric field is a first electric field, and wherein forming the second hafnium-containing gate dielectric layer includes simultaneously applying a second electric field.

7. The method of claim 1, wherein annealing the first and the second hafnium-containing gate dielectric layers increases an amount of ferroelectric orthorhombic phase of a hafnium-containing material included in the first and the second hafnium-containing gate dielectric layers.

8. The method of claim 1, wherein the second hafnium-containing gate dielectric layer is formed to directly contact the semiconductor layer.

9. A method of fabricating a semiconductor device, comprising:
    removing a dummy gate stack disposed over a semiconductor layer and interposed between gate spacers to form a gate trench;
    selectively depositing a sacrificial layer along sidewall surfaces of the gate spacers but not along the semiconductor layer in the gate trench;
    after forming the sacrificial layer, depositing a hafnium-containing dielectric material along the semiconductor layer but not along the sacrificial layer to form a first gate dielectric layer in the gate trench, wherein the depositing includes applying a first electric field;
    after forming the first gate dielectric layer, removing the sacrificial layer to expose the sidewall surfaces of the gate spacers in the gate trench;
    after removing the sacrificial layer, depositing the hafnium-containing dielectric material along the exposed sidewall surfaces of the gate spacers in the gate trench to form a second gate dielectric layer, wherein the depositing includes applying a second electric field;
    applying an annealing treatment to the first and the second gate dielectric layers, wherein the applying increases degree of ferroelectricity of the first and the second gate dielectric layers; and
    after applying the annealing treatment, forming a metal gate electrode over the first and the second gate dielectric layers.

10. The method of claim 9, wherein forming the sacrificial layer includes forming a self-assembled monolayer.

11. The method of claim 9, further comprising performing a cleaning process to the semiconductor layer before forming the sacrificial layer.

12. The method of claim 9, wherein applying the annealing treatment includes applying a third electric field to the first and the second gate dielectric layers, and wherein the first, the second, and the third electric fields are applied in a same magnitude and in a same direction with respect to the semiconductor layer.

13. The method of claim 9, wherein removing the sacrificial layer includes applying a solvent of sulfuric acid, hydrogen peroxide, or a combination thereof.

14. The method of claim 9, wherein a thickness of the second gate dielectric layer is less than a thickness of the first gate dielectric layer.

15. A method of fabricating a semiconductor device, comprising:
    forming a dummy gate stack over a semiconductor layer protruding from a substrate;
    forming gate spacers on sidewalls of the dummy gate stack;
    removing the dummy gate stack to form a gate trench defined by the gate spacers;
    depositing a sacrificial layer along the sidewalls but not along a bottom surface of the gate trench;
    forming an interfacial layer over the bottom surface of the gate trench and between portions of the sacrificial layer;
    depositing a first hafnium-containing layer over the interfacial layer;
    selectively removing the sacrificial layer with respect to the first hafnium-containing layer and the interfacial layer, thereby forming an opening in the gate trench to expose the sidewalls of the gate spacers, sidewalls of the first hafnium-containing layer, and sidewalls of the interfacial layer;
    depositing a second hafnium-containing layer on the first hafnium-containing layer and along the exposed sidewalls of the gate spacers in the gate trench, wherein the second hafnium-containing layer fills the opening to extend below a top surface of the interfacial layer;
    annealing the first and the second hafnium-containing layers, wherein the annealing includes simultaneously applying an electric field; and
    forming a metal gate electrode over the anneal first and second hafnium-containing layers to fill the gate trench.

16. The method of claim 15, wherein the electric field is a first electric field, and wherein depositing the first hafnium-containing layer includes simultaneously applying a second electric field.

17. The method of claim 15, wherein the electric field is a first electric field, and wherein depositing the second hafnium-containing layer includes simultaneously applying a second electric field.

18. The method of claim 15, wherein depositing the second hafnium-containing layer results in the second hafnium-containing layer to directly contact the semiconductor layer.

19. The method of claim 15, wherein depositing the sacrificial layer includes depositing a layer of graphene or a self-assembled monolayer.

20. The method of claim 15, wherein the first and the second hafnium-containing layers include hafnium oxide, and wherein annealing the first and the second hafnium-containing layers increases an amount of ferroelectric orthorhombic phase of the hafnium oxide in the first and the second hafnium-containing layers.

* * * * *